| (12) | United States Patent<br>Guo | (10) Patent No.: US 12,046,472 B2<br>(45) Date of Patent: Jul. 23, 2024 |
|---|---|---|

(54) METHOD FOR MANUFACTURING SEMICONDUCTOR STRUCTURE

(71) Applicant: CHANGXIN MEMORY TECHNOLOGIES, INC., Hefei (CN)

(72) Inventor: Shuai Guo, Hefei (CN)

(73) Assignee: CHANGXIN MEMORY TECHNOLOGIES, INC., Hefel (CN)

( * ) Notice: Subject to any disclaimer, the term of this patent is extended or adjusted under 35 U.S.C. 154(b) by 458 days.

(21) Appl. No.: 17/456,071

(22) Filed: Nov. 22, 2021

(65) Prior Publication Data

US 2022/0319848 A1 Oct. 6, 2022

Related U.S. Application Data

(63) Continuation of application No. PCT/CN2021/112301, filed on Aug. 12, 2021.

(30) Foreign Application Priority Data

Mar. 30, 2021 (CN) .......................... 202110341446.0

(51) Int. Cl.
*H01L 21/033* (2006.01)
*H01L 21/311* (2006.01)

(52) U.S. Cl.
CPC .... *H01L 21/0337* (2013.01); *H01L 21/31116* (2013.01); *H01L 21/31144* (2013.01)

(58) Field of Classification Search
None
See application file for complete search history.

(56) References Cited

U.S. PATENT DOCUMENTS

| 2010/0173492 | A1* | 7/2010 | Kim | .................... | H01L 21/0337 |
| | | | | | 438/689 |
| 2020/0185274 | A1* | 6/2020 | Yang | .................. | H01L 21/76808 |
| 2021/0351036 | A1* | 11/2021 | Wang | .................. | H01L 21/0338 |
| 2022/0246477 | A1* | 8/2022 | Shin | .................. | H01L 29/66545 |
| 2023/0343641 | A1* | 10/2023 | Tirukkonda | ........... | H10B 41/10 |

* cited by examiner

*Primary Examiner* — Asok K Sarkar
(74) *Attorney, Agent, or Firm* — Kilpatrick Townsend & Stockton LLP

(57) ABSTRACT

The embodiment of the application provides a method of manufacturing a semiconductor structure, which comprises the following steps: forming a target layer, a first mask layer, an isolation layer and an intermediate layer sequentially on a substrate, wherein first trench is disposed in the intermediate layer in the first region and second trench is disposed in the intermediate layer in the second region; forming a fill layer, and the difference in the height between the top surface of the fill layer in the first region and in the second region is less than or equal to a first preset value; removing a portion of the fill layer in the first region until the top surface of the sacrificial layer is exposed; removing the sacrificial layer; and etching a portion of the target layer through the first opening, wherein the remaining target layer forms a target pattern.

15 Claims, 17 Drawing Sheets

METHOD FOR MANUFACTURING SEMICONDUCTOR STRUCTURE

CROSS-REFERENCE TO RELATED APPLICATIONS

This application is a continuation application of International Patent Application No. PCT/CN2021/112301, which claims priority to Chinese Patent Application No. 202110341446.0, filed with the Chinese Patent Office on Mar. 30, 2021 and entitled "METHOD FOR MANUFACTURING SEMICONDUCTOR STRUCTURE." International Patent Application No. PCT/CN2021/112301 and Chinese Patent Application No. 202110341446.0 are incorporated herein by reference in their entireties.

TECHNICAL FIELD

The present application relates to the field of semiconductors, and in particular to a method for manufacturing a semiconductor structure.

BACKGROUND

Before subjecting a layer to selective etching, it is generally necessary to form a mask layer with an opening pattern. The mask layer may be either a photoresist layer or a mask layer composed of one or more other materials. The opening pattern may be formed either by exposing and developing photoresist, or by etching particular materials in a composite layer which are generally formed in a particular position in advance and occupy the position of a to-be-formed opening pattern.

However, the etching of a to-be-etched region may be affected by adjacent regions. For example, a particular material is covered and cannot be exposed to the etching agent such that a preset opening pattern cannot be formed, thereby subjecting the target layer to incomplete selective etching.

SUMMARY

The embodiment of the application provides a method of manufacturing a semiconductor structure, where by selective etching can be performed completely to the target layer.

To solve the above problems, the embodiment of the application provides a method of manufacturing a semiconductor structure, which comprises the following steps: providing a substrate, comprising a first region, a second region, and a third region, wherein the second region is disposed between the first region and the third region; forming a target layer, a first mask layer, an isolation layer and an intermediate layer sequentially on the substrate, wherein the intermediate layer in the first region has at least one first trench therein which exposes the isolation layer, and the bottom and the sidewall of the first trench are covered with a sacrificial layer; etching a portion of the intermediate layer in the second region to form at least one second trench which is disposed in the intermediate layer in the second region; forming a fill layer which fills the first trench and the second trench, wherein the top surface of the fill layer is higher than the top surface of the intermediate layer, and the height difference between the top surface of the fill layer in the first region and the top surface of the fill layer in the second region is smaller than or equal to a first preset value in the direction perpendicular to the top surface of the substrate; performing a maskless dry etching process to remove a portion of the fill layer in the first region until the top surface of the sacrificial layer is exposed and the remaining fill layer in the first region fills the first trench; removing the sacrificial layer which covers the sidewall of the first trench to form a first opening in the first region, wherein the first opening exposes the surface of the isolation layer; and etching sequentially a portion of the isolation layer, a portion of the first mask layer and a portion of the target layer in the first region through the first opening, whereby the remaining target layer forms a target pattern.

BRIEF DESCRIPTION OF DRAWINGS

One or more embodiments are illustrated by way of example with reference to the accompanying drawings, and the figures in the drawings are not to be limiting to scale unless specifically stated.

DESCRIPTION OF EMBODIMENTS

Figure 1:
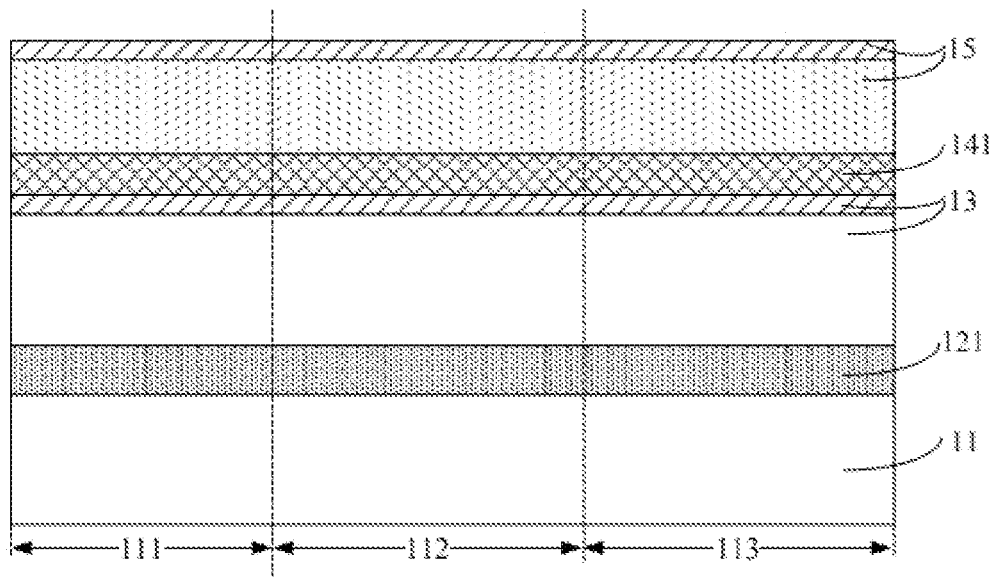
FIGS. 1 to 18 are schematic structure diagrams corresponding to each step in a method of manufacturing a semiconductor structure.

FIGS. 1 to 18 are schematic structure diagrams corresponding to each step in a method of manufacturing a semiconductor structure. The method thereof comprises the following steps:

Referring to FIG. 1, there is provided a substrate 11, comprising a first region 111, a second region 112 and a third region 113, wherein the second region 112 is disposed between the first region 111 and the third region 113; and a target layer 121, a protective layer 13, an initial mask layer 141 and an initial intermediate layer 15 are formed on the substrate 11, which are stacked in sequence.

Figure 2:
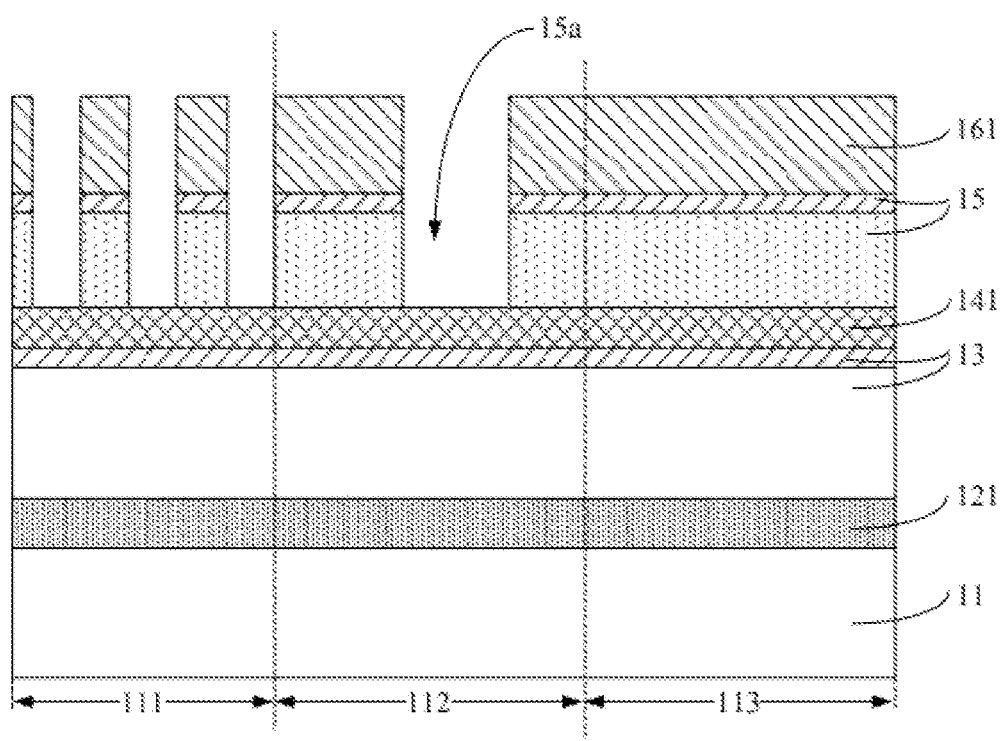

Referring to FIG. 2, a first photoresist layer 161 having a first opening pattern is formed on the initial intermediate layer 15; and the initial intermediate layer 15 is etched with the first opening pattern to form an intermediate trench 15a which exposes the surface of the initial mask layer 141.

The arrangement density of the intermediate trenches 15a in the first region 111 is higher than the arrangement density of the intermediate trenches 15a in the second region 112, and the arrangement density of the intermediate trenches 15a in the second region 112 is higher than the arrangement density of the intermediate trenches 15a in the third region 113.

Figure 3:
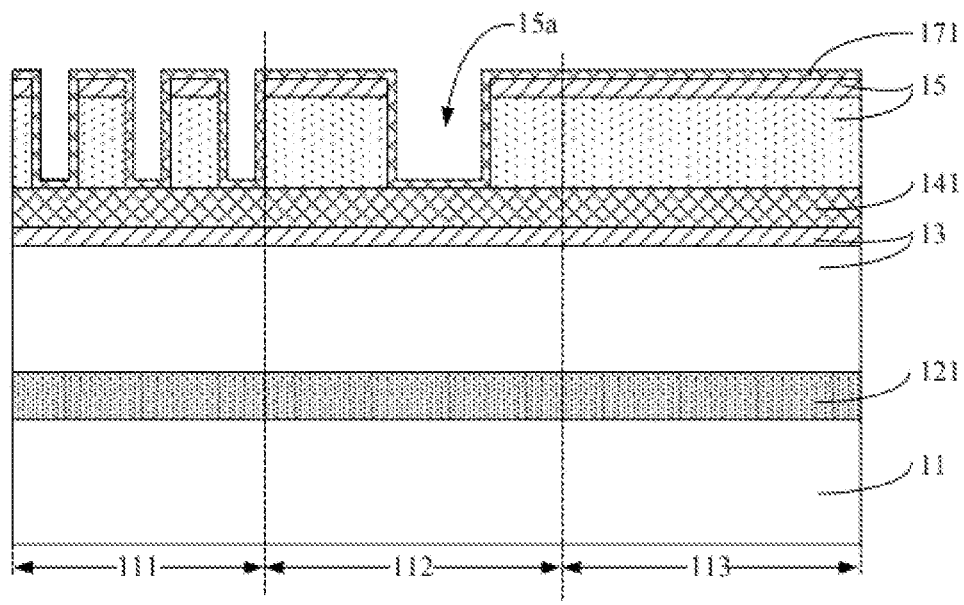

Referring to FIG. 3, there is formed an initial sacrificial layer 171 covering the bottom and the sidewall of the intermediate trench 15a, and the initial sacrificial layer 171 also covers the tops of the initial intermediate layers 15 in the first region 111, the second region 112 and the third region 113.

Figure 4:
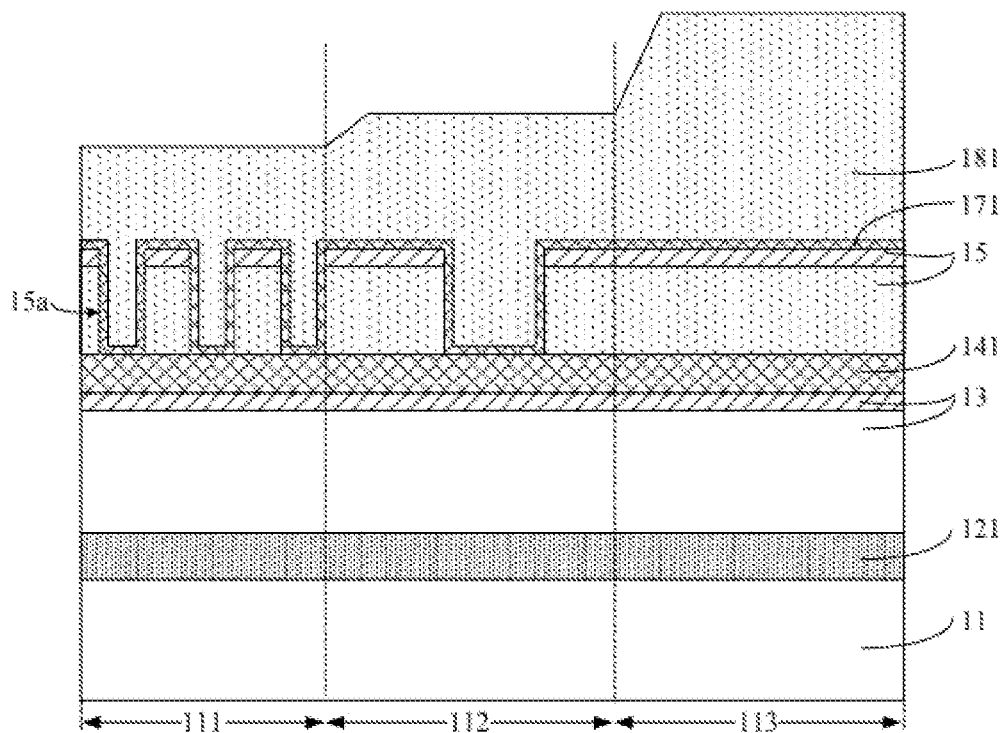

Referring to FIG. 4, a deposition process is performed to form an initial fill layer 181 filling the intermediate trench 15a.

In performing a maskless deposition process, the deposition rates and the deposition time in different regions are the same. That is, the total material of the initial fill layer 181 deposited per unit area in any region is the same. Since the arrangement density of the intermediate trenches 15a in the first region 111, the second region 112 and the third region 113 decreases gradually, the first region 111 comprises the most number of intermediate trenches 15a per unit area and the second region 112 comprises the second most number of intermediate trenches 15a per unit area. The more intermediate trenches 15a there are, the more the material of the initial fill layer 181 can be accommodated, the less redundant material of the initial fill layer 181 there will be left on the initial intermediate layer 15 and the lower the top surface of the initial fill layer 181 will be. Accordingly, the top surface of the initial fill layer 181 in the first region 111, the second region 112 and the third region 113 rises gradually.

Figure 5:
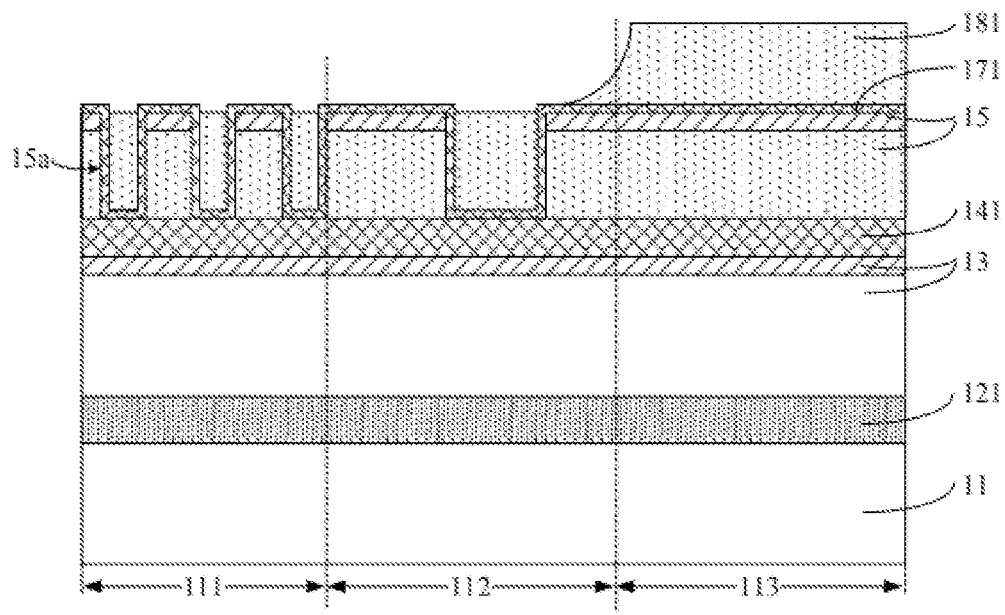
Figure 6:
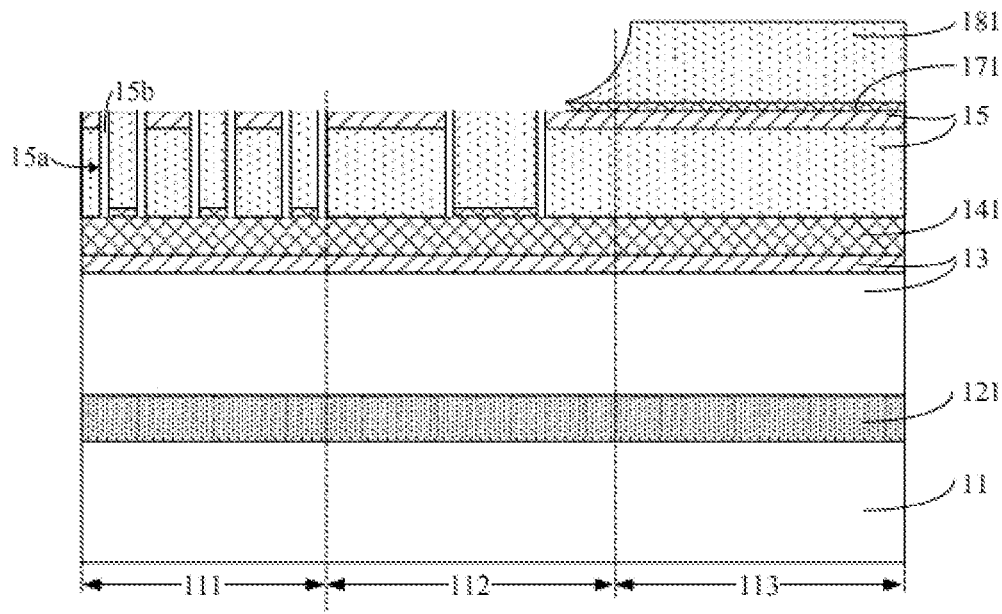

Referring to FIGS. 5 and 6, the initial fill layer 181 is etched and the remaining initial fill layer 181 exposes the top surface of the initial sacrificial layer 171 which covers the sidewall of the intermediate trench 15a; and the initial sacrificial layer 171 covering the sidewall of the intermediate trench 15a is etched to form an initial gap 15b which exposes the surface of the initial mask layer 141.

Herein, since the initial mask layer 141 in the third region 113 need not be etched, an initial gap 15b need not be formed in the third region 113. Accordingly, there is no intermediate trench 15a and initial sacrificial layer 171 in the initial intermediate layer 15 in the third region 113, and the initial fill layer 181 in the third region 113 need not be removed.

Figure 7:
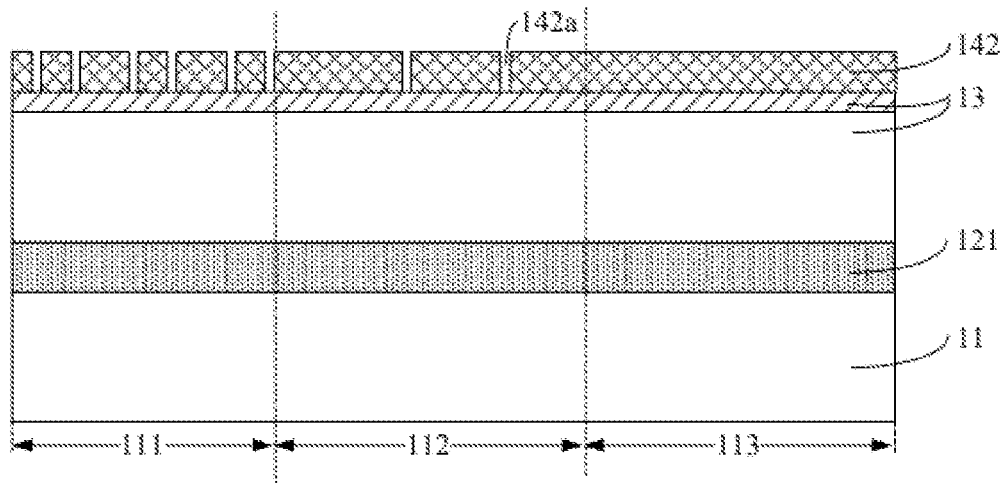

Referring to FIGS. 6 and 7, the initial mask layer 141 is etched through the initial gap 15b to form a first mask layer 142; and the remaining initial intermediate layer 15, the remaining initial sacrificial layer 171 and the remaining initial fill layer 181 are removed after the first mask layer 142 is formed.

The first mask layer 142 has a plurality of fourth openings 142a with the same opening width in a direction parallel to the substrate 11, wherein the width of the fourth opening 142a is equal to the thickness of the initial sacrificial layer 171 which covers the sidewall of the intermediate trench 15a; in addition, since the arrangement density of the intermediate trenches 15a in the first region 111, the second region 112 and the third region 113 decreases gradually, the arrangement density of the initial gaps 15b in the first region 111, the second region 112 and the third region 113 decreases gradually, and the arrangement density of the fourth openings 142a in the first region 111, the second region 112 and the third region 113 decreases gradually.

Figure 8:
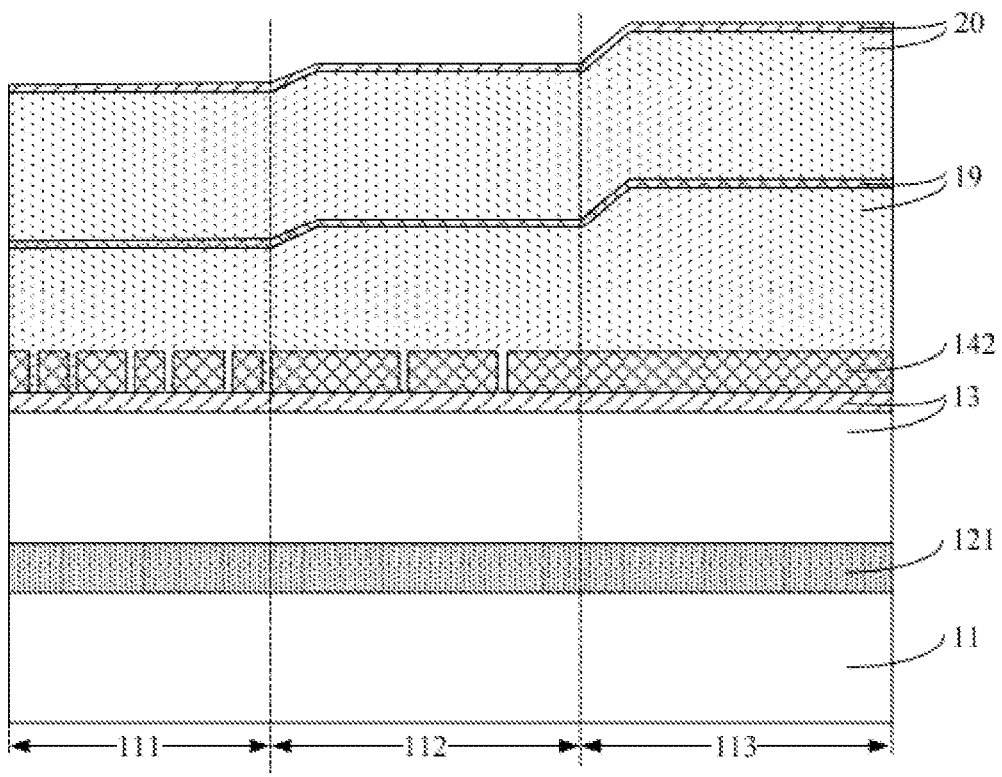

Referring to FIG. 8, there is formed on the first mask layer 142 an isolation layer 19 and an intermediate layer 20 stacked in sequence.

Since the arrangement density of the fourth openings 142a in the first region 111, the second region 112 and the third region 113 decreases gradually, the top surface of the isolation layer 19 in the first region 111, the second region 112, and the third region 113 gradually rises when the isolation layer 19 and the intermediate layer 20 are uniformly deposited in different regions. Accordingly, the top surface of the intermediate layer 20 in the first region 111, the second region 112 and the third region 113 gradually rises.

Figure 9:
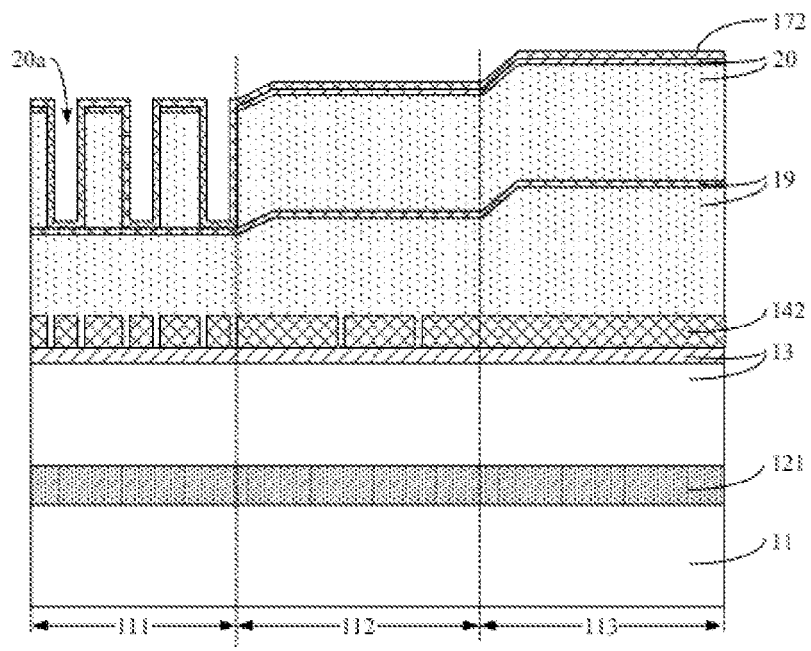

Referring to FIG. 9, there is formed in the intermediate layer 20 in the first region 111 at least one first trench 20a, which exposes the surface of the isolation layer 19; and there is formed a first sacrificial layer 172 which covers the bottom and the sidewall of the first trench 20a and the top surface of the intermediate layer 20 in the first region 111, the second region 112 and the third region 113.

Figure 10:
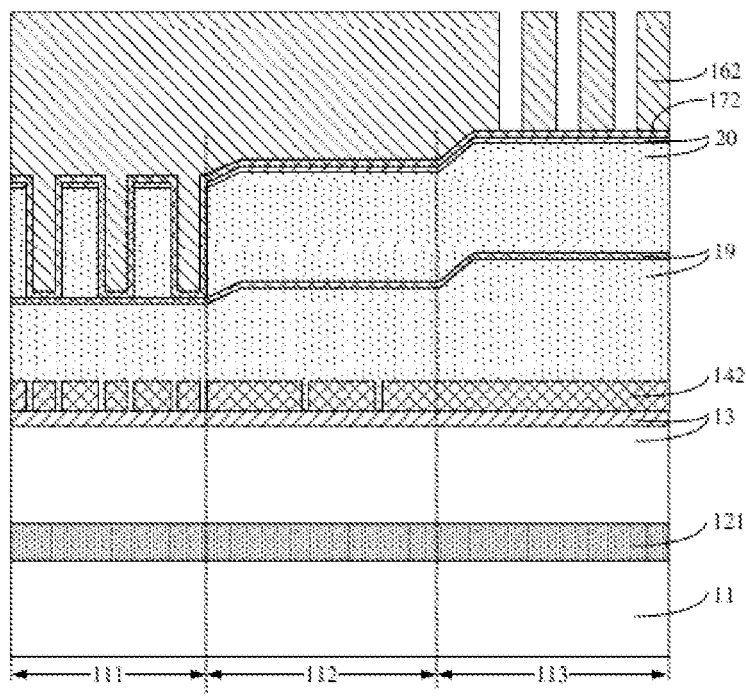

Referring to FIG. 10, a second photoresist layer 162 is formed which fills the first trench 20a and is disposed on the intermediate layer 20 in the first region 111, the second region 112, and the third region 113. The second photoresist layer 162 has a second opening pattern disposed in the third region 113.

Figure 11:
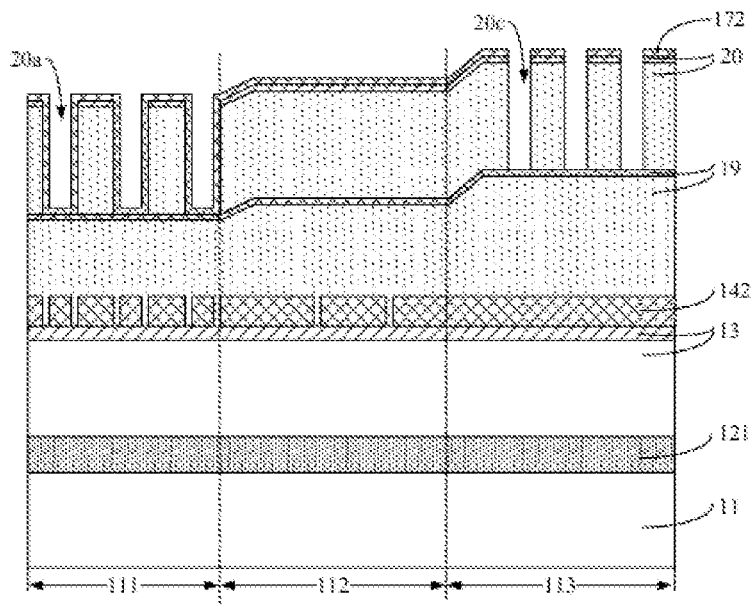

Referring to FIG. 11, the first sacrificial layer 172 and the intermediate layer 20 are etched with the second opening pattern to form a third trench 20C which is disposed in the intermediate layer 20 in the third region 113; and the second photoresist layer is removed after the third trench 20C is formed.

Figure 12:
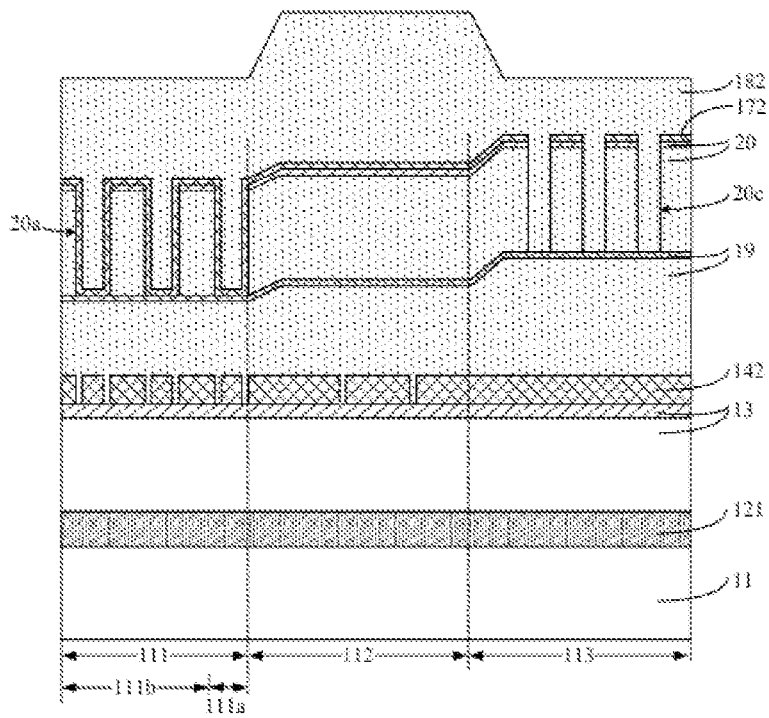

Referring to FIG. 12, a fill layer 182 is formed which fills the first trench 20a and the third trench 20c, and the upper surface of the fill layer 182 is higher than the upper surface of the intermediate layer 20.

Since the deposition processes have the same deposition rate and deposition time in different regions, the total material of the fill layer 182 deposited per unit area in any region is the same. The top surface positions of the fill layer 182 in the different regions depend on two factors: one is the top surface position of the intermediate layer 20 in a region and the other is the arrangement density and the opening width of the trenches or the openings in the intermediate layer 20 in a region. The higher the top surface of the intermediate layer 20 is, the higher the top surface of the fill layer 182 is. Whereas the higher the arrangement density and the opening width of the trenches or openings in the intermediate layer 20 is, the lower the top surface of the fill layer 182 is.

Specifically, the top surface of the intermediate layer 20 in the first region 111 is lower than the top surface of the intermediate layer 20 in the second region 112, and the intermediate layer 20 in the first region 111 has the first trench 20a therein while the intermediate layer 20 in the second region 112 does not have a trench or an opening therein. Accordingly, the top surface of the fill layer 182 in the first region 111 is lower than the top surface of the fill layer 182 in the second region 112.

When the difference between the height of the top surface of the fill layer 182 in the first region 111 and the height of the top surface of the fill layer 182 in the second region 112 is bigger than the first preset value, a portion of the fill layer 182 material at the edge of the second region 112 may collapse for lack of support and may slide toward a first edge region 111a in the first region 111, such that the top surface of the fill layer 182 in the first edge region 111a is higher. In other words, the fill layer 182 on the intermediate layer 20 in the first edge region 111a is thicker, whereas the fill layer 182 on the intermediate layer 20 in the first central region 111b is thinner.

Further, if the fill layer 182 is formed using a spin-coating process, the whole structure of the fill layer 182 will be loose and the strength of the structure will be low, thereby making the layer prone to collapse for lack of support. Accordingly, if the material of the fill layer 182 is carbon or a carbon-containing organic substance, the fill layer 182 which will have a softer texture, lower hardness and lower structure strength is also prone to collapse for lack of support.

In addition, although the top surface of the intermediate layer 20 in the second region 112 is lower than the top surface of the intermediate layer 20 in the third region 113, the intermediate layer 20 in the third region 113 has the third trenches 20C therein such that the top surface of the fill layer 182 in the third region 113 may be higher or lower than or flush with the top surface of the fill layer 182 in the second region 112 as the third trenches 20C vary in arrangement density and opening width.

When the top surface of the fill layer 182 in the third region 113 is higher than the top surface of the fill layer 182 in the second region 112, a portion of the fill layer 182 material in the third region 113 may collapse for lack of support and may slide to the second region 112 or even the first region 111, such that the top surface of the fill layer 182 in the first edge region 111a is higher; and when the top surface of the fill layer 182 in the third region 113 is lower than the top surface of the fill layer 182 in the second region 112, a portion of the fill layer 182 material in the second region 112 may slide to the third region 113, thereby lowering the top surface of the fill layer 182 in the second region 112 and reducing the height difference between the top surface of the fill layer 182 in the first region 111 and the top surface of the fill layer 182 in the second region 112, which helps prevent a portion of the fill layer 182 material in the second region 112 from sliding to the first region 111.

Figure 13:
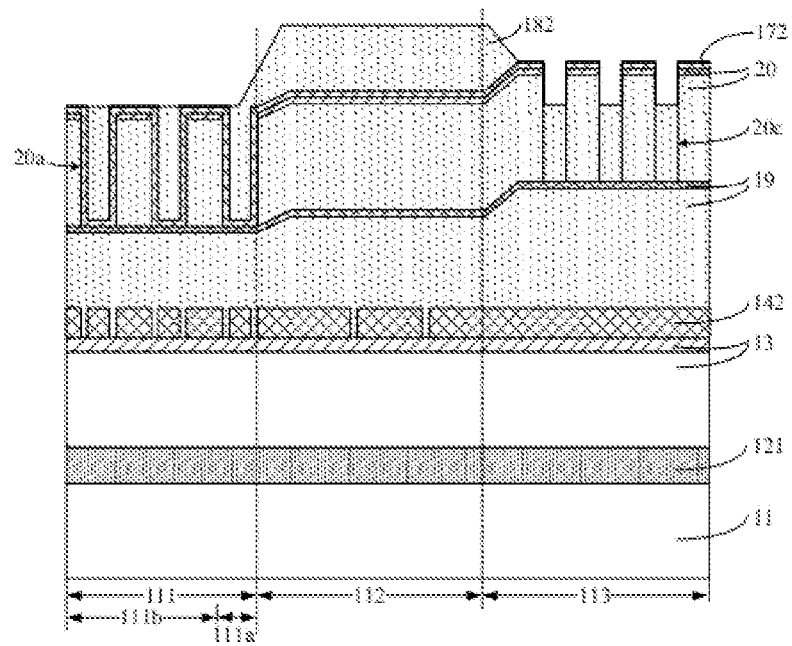

Referring to FIG. 13, the fill layer 182 is etched using a maskless dry etching process.

In the process of a maskless dry etching, the to-be-etched fill layers 182 in different regions have the same thickness. If the fill layer 182 on the intermediate layer 20 in the first edge region 111a is thicker and the fill layer 182 on the intermediate layer 20 in the first central region 111b is thinner, the top surface of the first sacrificial layer 172 in the first edge region 111a is still covered by the fill layer 182 when the top surface of the first sacrificial layer 172 in the first central region 111b is exposed.

Figure 14:
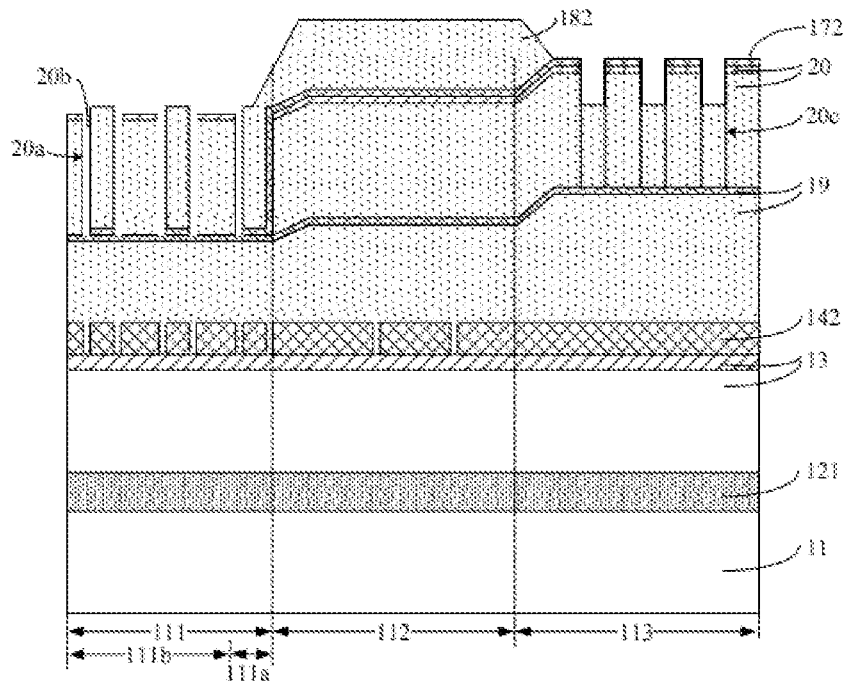
Figure 15:
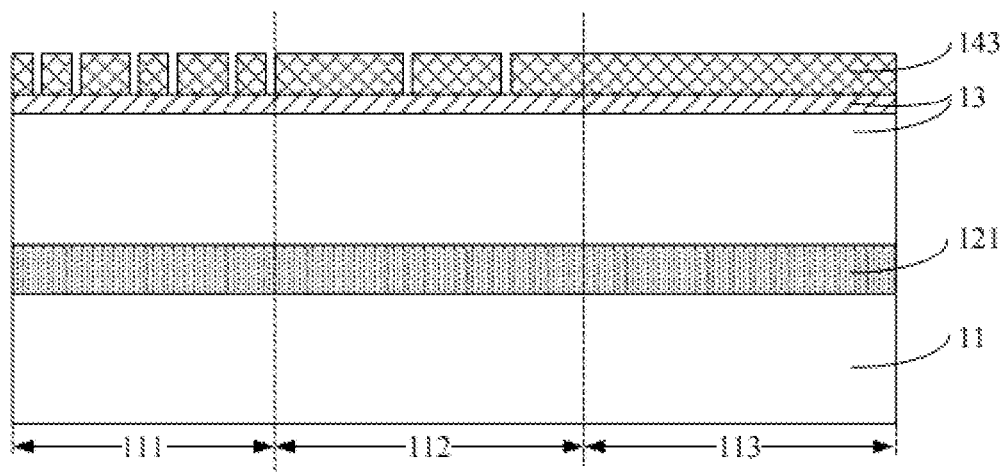

Referring to FIGS. 14 and 15, the first sacrificial layer 172 on the sidewall of the first trench 20a is etched to form a first opening 20b; the isolation layer 19 and the first mask layer 142 are sequentially etched through the first opening 20b to form a second mask layer 143; and after the second mask layer 143 is formed, the remaining isolation layer 19, the remaining intermediate layer 20, the remaining first sacrificial layer 172 and the remaining fill layer 182 are removed.

Since the fill layer 182 is still left on the intermediate layer 20 in the first edge region 111a, the first sacrificial layer 172 which covers the sidewall of the first trench 20a has not been completely etched. Therefore, the pattern of the first opening 20b is incomplete, and the opening pattern of the second mask layer 143 which is formed by etching through the first opening 20b is also incomplete.

Figure 16:
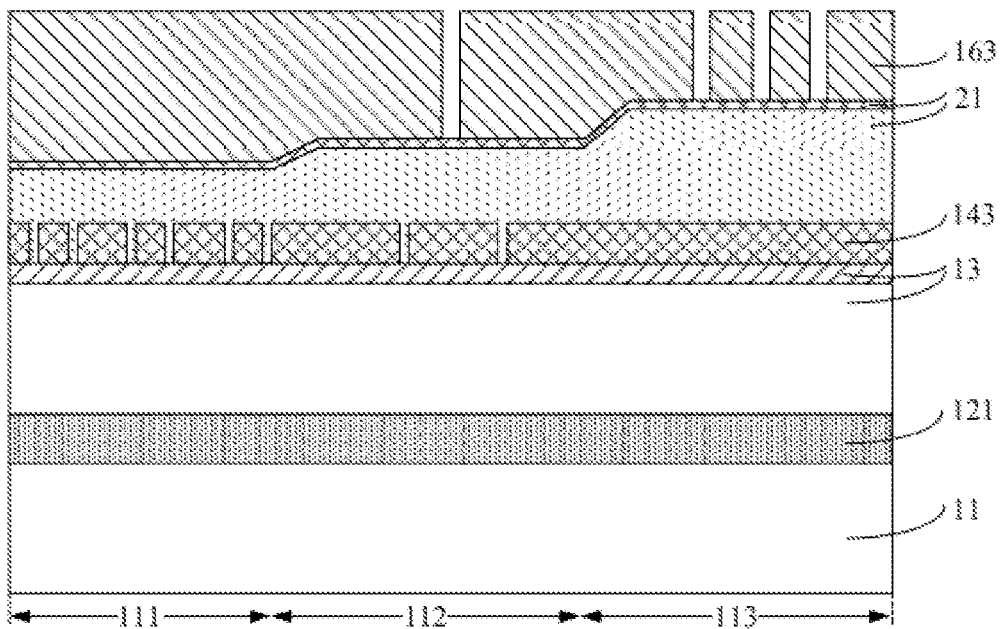

Referring to FIG. 16, a transfer layer 21 and a third photoresist layer 163 are formed which are sequentially stacked, wherein the third photoresist layer 163 has a third opening pattern disposed in the second region 112 and the third region 113.

Figure 17:
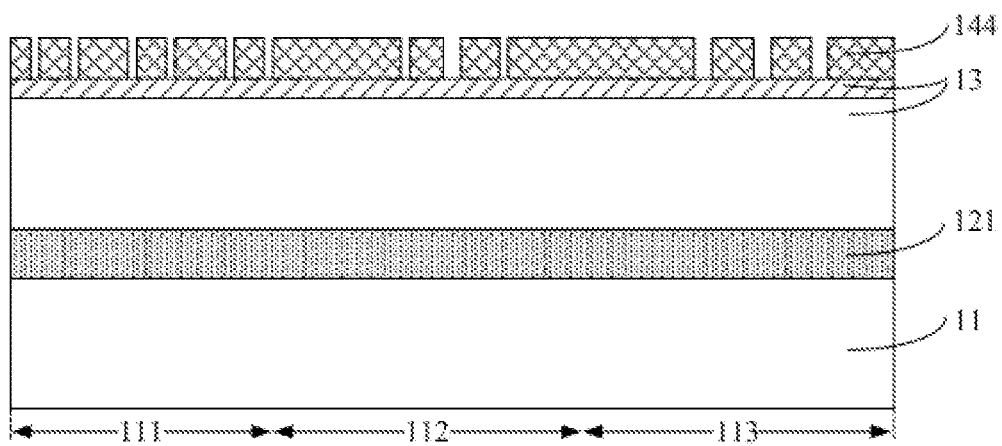
Figure 18:
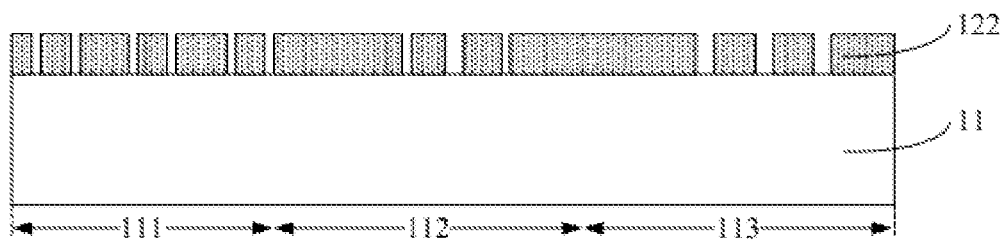

Referring to FIGS. 17 and 18, the transfer layer 21 and the second mask layer 143 are sequentially etched using the third opening pattern to form a third mask layer 144; and after the third mask layer 144 is formed, the remaining transfer layer 21 and the third photoresist layer 163 are removed, and the protective layer 13 and the target layer 121 are sequentially etched through the opening pattern of the third mask layer 144, wherein the remaining target layer 121 serves as the target pattern 122.

Since the opening pattern of the second mask layer 143 is incomplete, the opening pattern of the third mask layer 144 and the ultimately formed target pattern 122 are incomplete.

In order to further clarify the purpose, technical schemes and advantages of the embodiment of the present application, the embodiment of the present application will be described in detail with reference to the accompanying drawings. However, one of ordinary skill in the art will appreciate that in the embodiment of the present application a plurality of technical details have been presented for readers to better understand this application. However, even without these technical details and various changes and modifications based on the following embodiment the technical schemes claimed herein may be realized.

Figure 19:
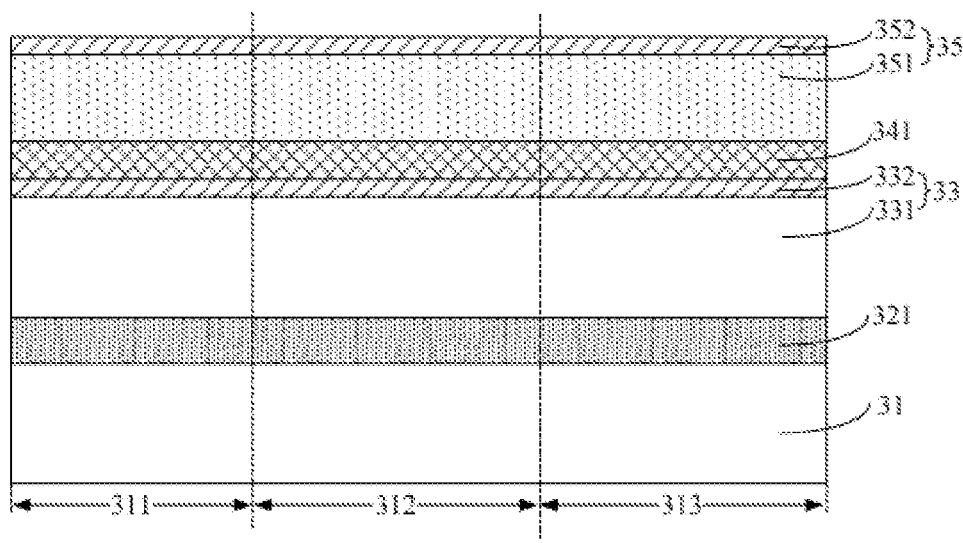
FIGS. 19 to 35 are schematic structure diagrams corresponding to each step in the method of manufacturing a semiconductor structure provided by the embodiment of the present application.

FIGS. 19 to 35 are schematic structure diagrams corresponding to each step of the method of manufacturing a semiconductor structure provided by the embodiment of the present application. The method comprises the following steps:

Referring to FIG. 19, there is provided a substrate 31, comprising a first region 311, a second region 312 and a third region 313, wherein the second region 312 is disposed between the first region 311 and the third region 313; and there are formed on the substrate 31 a target layer 321, a protective layer 33, an initial mask layer 341 and an initial intermediate layer 35 which are sequentially stacked.

In the present embodiment, the first region 311 is an array region, the second region 312 is a core region, and the third region 313 is a peripheral region. The array region, the core region and the peripheral region all comprise a bit line structure, and the arrangement density of the bit line structures in the array region is higher than the arrangement density of the bit line structures in the core region and in the peripheral region.

It should be noted that the first region 311, the second region 312, and the third region 313 refer to the different regions of the semiconductor structure which are divided with reference to the substrate 31, and do not simply refer to the different parts of the substrate 31. The first region 311 comprises a portion of the substrate 31 and other layers formed on the substrate 31.

In the present embodiment, the protective layer 33 comprises a first protective layer 331 and a second protective layer 332 stacked in sequence, wherein the second protective layer 332 has a higher hardness than the initial mask layer 341 and can be used as a hard mask layer complementary to the initial mask layer 341. Specifically, the material of the initial mask layer 341 comprises silicon dioxide and the material of the second protective layer 332 comprises silicon oxynitride. The initial intermediate layer 35 comprises a first initial intermediate layer 351 and a second initial intermediate layer 352 which are sequentially stacked, and the first initial intermediate layer 351 having the same material as the second protective layer 332 can be used as a hard mask layer complementary to a subsequently formed photoresist layer on the initial intermediate layer 35.

The first protective layer 331 may have a lower hardness than the second protective layer 332 in order to shorten the duration of the etching process and to avoid damages to the target layer 321; and similarly, the first initial intermediate layer 351 may have a lower hardness than the second initial intermediate layer 352 in order to shorten the duration of the etching process and to avoid damages to the initial mask layer 341.

Figure 20:
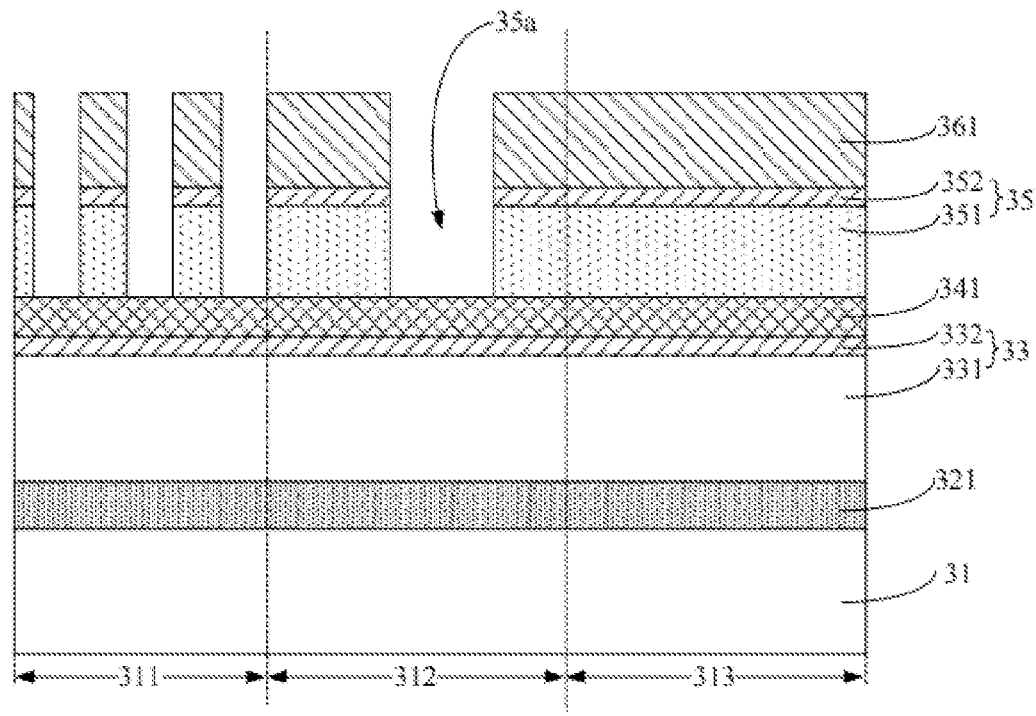

Referring to FIG. 20, a first photoresist layer 361 having a first opening pattern is formed on the initial intermediate layer 35; and the initial intermediate layer 35 is etched through the first opening pattern to form an intermediate trench 35a which exposes the surface of the initial mask layer 341.

In the embodiment, the arrangement density of the intermediate trenches 35a of the first region 311 is higher than the arrangement density of the intermediate trenches 35a in the second region 312, and the arrangement density of the intermediate trenches 35a in the second region 312 is higher than the arrangement density of the intermediate trenches 35a in the third region 313; in addition, the first opening pattern and the intermediate trench 35a have a first extending direction, and specifically the first extending direction may be 120°.

Figure 21:
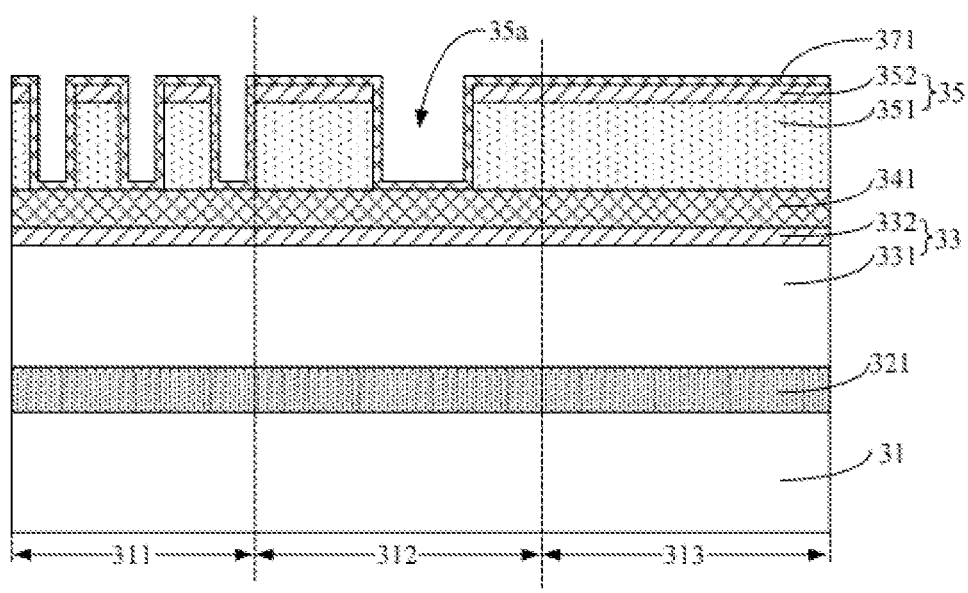

Referring to FIG. 21, an initial sacrificial layer 371 is formed, which covers the bottom and the sidewall of the intermediate trench 35a as well as the top surfaces of the initial intermediate layer 35 in the first region 311, the second region 312 and the third region 313.

Before the initial sacrificial layer 371 is formed, the first photoresist layer 361 needs to be removed; and the initial sacrificial layer 371 may have the same material as the initial mask layer 341, which helps to lessen the types of materials required for the semiconductor manufacturing process and to reduce the cost and the complexity of the semiconductor manufacturing process.

Figure 22:
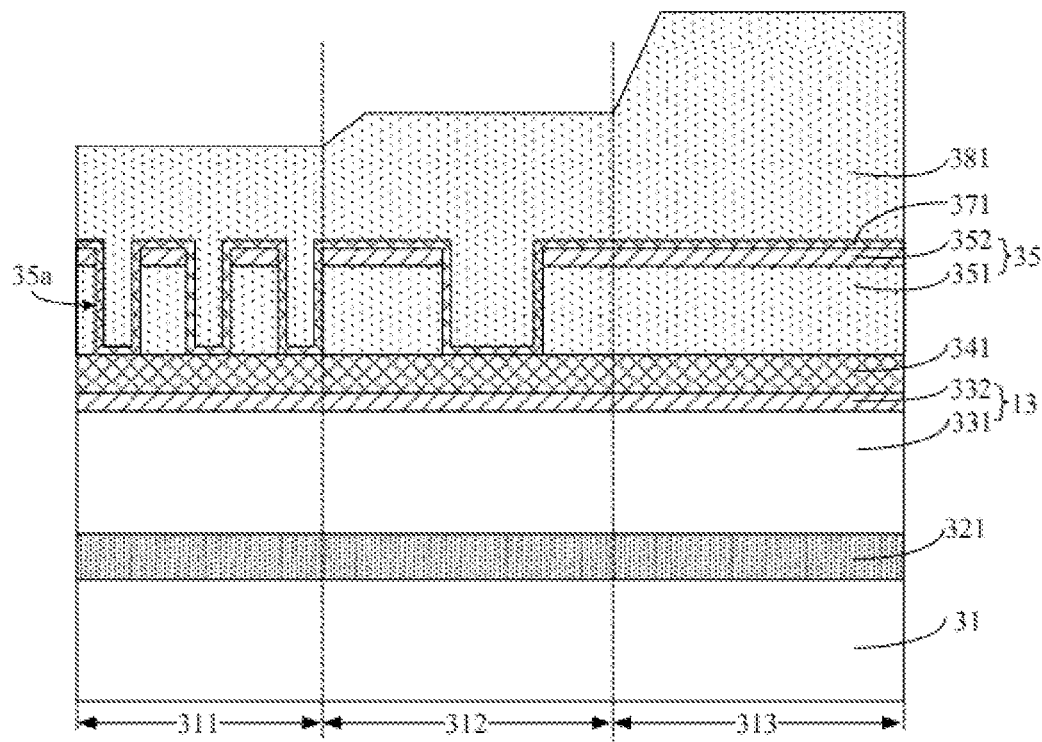

Referring to FIG. 22, a deposition process is performed to form an initial fill layer 381 filling the intermediate trench 35a.

In performing a maskless deposition process, the deposition rates and the deposition time in different regions are the same, that is, the total material of the initial fill layer 381 deposited per unit area in any region is the same. Since the arrangement density of the intermediate trenches 35a in the first region 311, the second region 312 and the third region 313 decreases gradually, the first region 311 comprises the most number of intermediate trenches 35a per unit area and the second region 312 comprises the second most number of intermediate trenches 35a per unit area. The more intermediate trenches 35a there are, the more the material of the initial fill layer 381 can be accommodated, the less redundant material of the initial fill layer 381 there will be left on the initial intermediate layer 35 and the lower the top surface of the initial fill layer 381 will be. Accordingly, the top surface of the initial fill layer 381 in the first region 311, the second region 312 and the third region 313 rises gradually.

Figure 23:
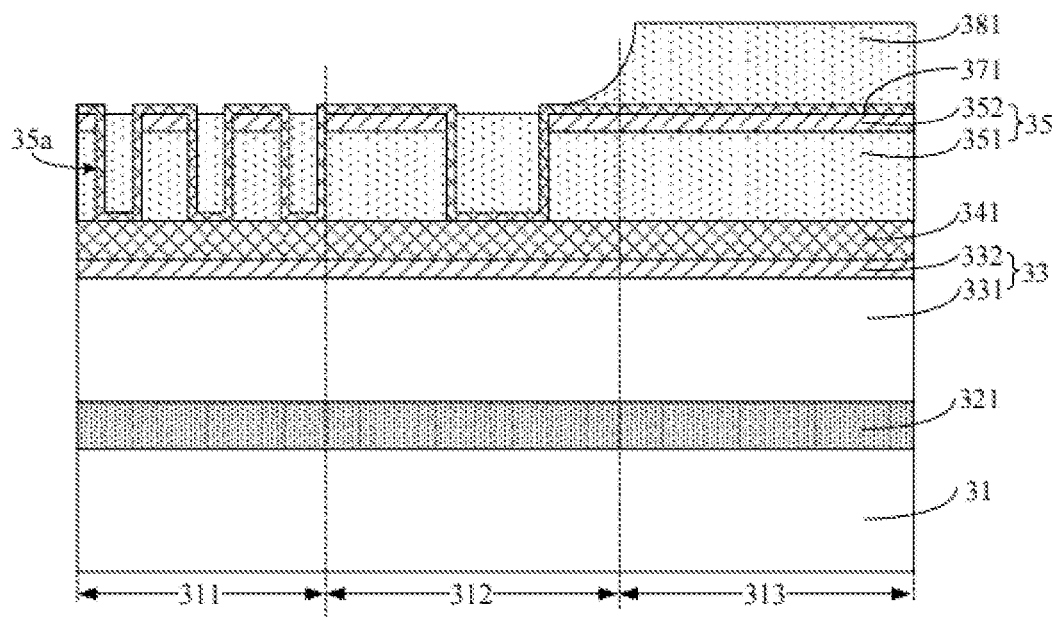
Figure 24:
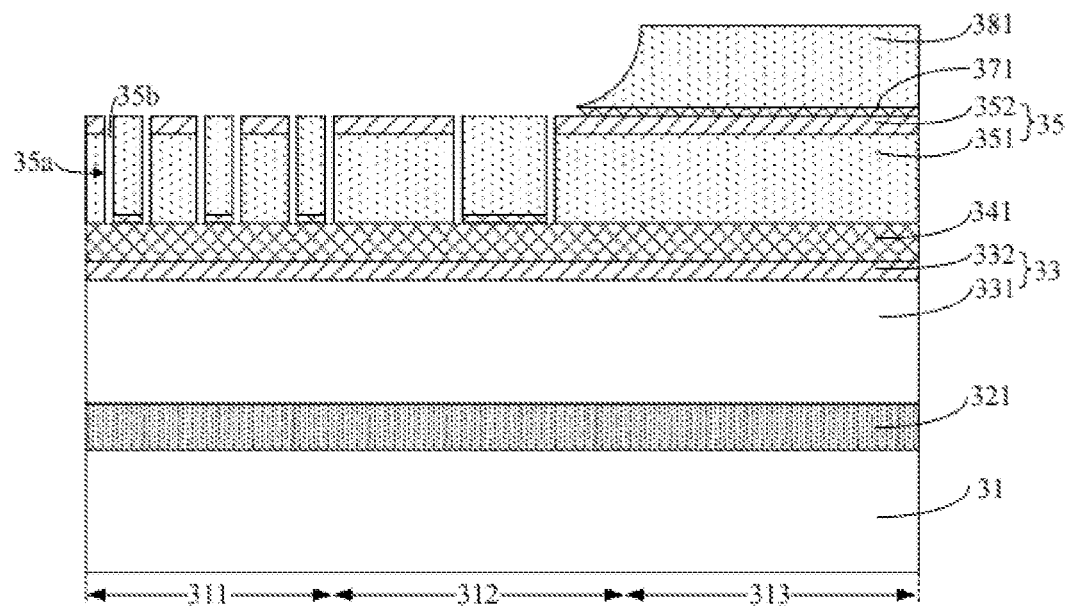

Referring to FIGS. 23 and 24, the initial fill layer 381 is etched and the remaining initial fill layer 381 exposes the top surface of the initial sacrificial layer 371 which covers the sidewall of the intermediate trench 35a; and the initial sacrificial layer 371 which covers the sidewall of the intermediate trench 35a is etched to form an initial gap 35b which exposes the surface of the initial mask layer 341.

In the present document, since the initial mask layer 341 in the third region 313 need not be etched, an initial gap 35b need not be formed in the third region 313. Accordingly, there is no intermediate trench 35a and no initial sacrificial layer 371 in the initial intermediate layer 35 in the third region 313, and the initial fill layer 381 in the third region 313 need not be removed.

Figure 25:
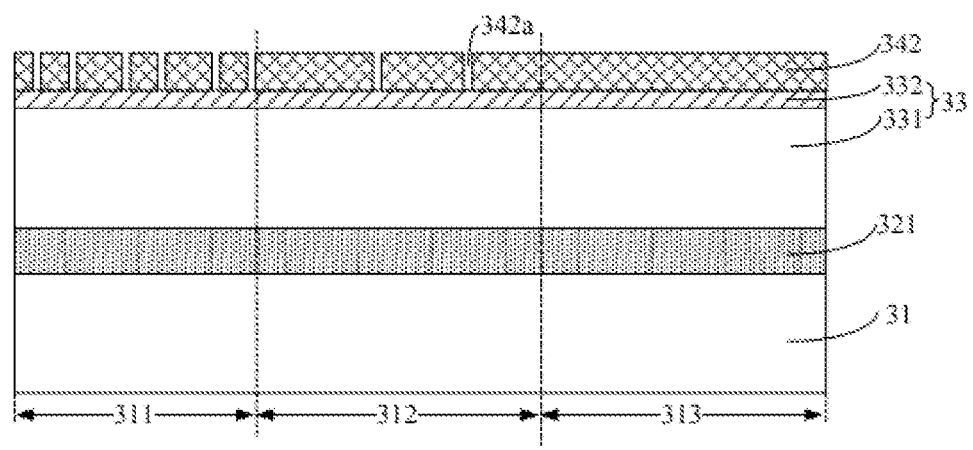

Referring to FIGS. 24 and 25, the initial mask layer 341 is etched through the initial gap 35b to form a first mask layer 342; and the remaining initial intermediate layer 35, the remaining initial sacrificial layer 371 and the remaining initial fill layer 381 are removed after the first mask layer 342 is formed.

The first mask layer 342 has a plurality of fourth openings 342a with the same opening width in a direction parallel to the substrate 31, wherein the width is equal to the thickness of the initial sacrificial layer 371 which covers the sidewall of the intermediate trench 35a; and the fourth opening 342a which has a first extending direction has the same extending direction as the intermediate trench 35a, in addition, since the arrangement density of the intermediate trenches 35a in the first region 311, the second region 312 and the third region 313 decreases gradually, the arrangement density of the initial gaps 35b in the first region 311, the second region 312 and the third region 313 decreases gradually, and the arrangement density of the fourth openings 342a in the first region 311, the second region 312 and the third region 313 decreases gradually.

Figure 26:
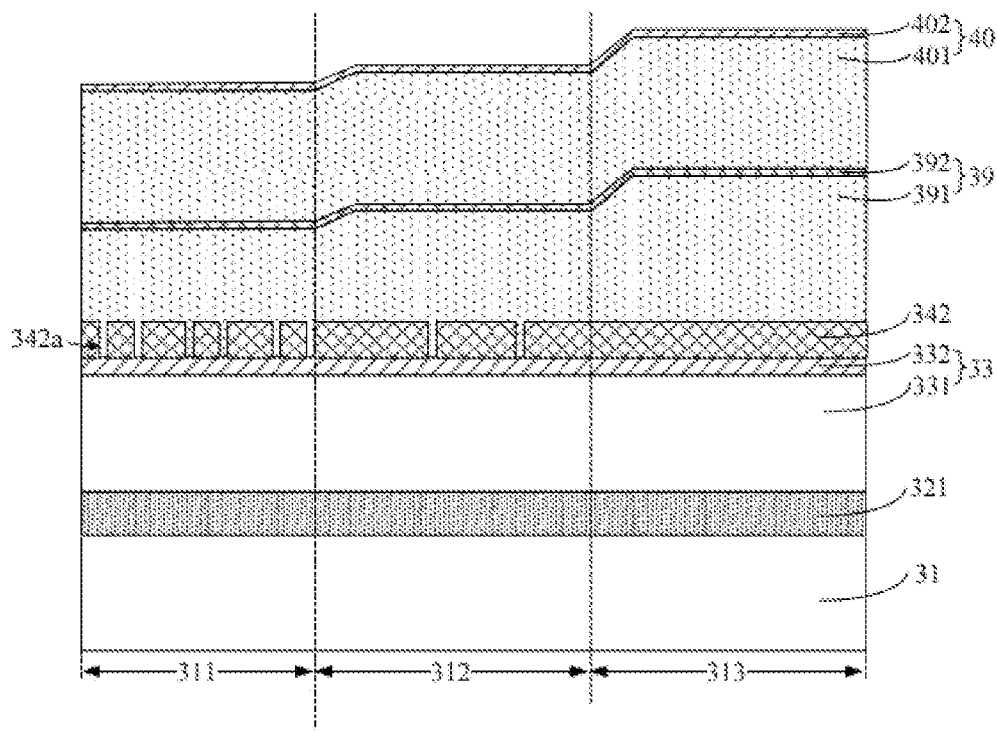

Referring to FIG. 26, there is formed on the first mask layer 342 an isolation layer 39 and an intermediate layer 40 stacked in sequence.

Since the arrangement density of the fourth openings 342a in the first region 311, the second region 312 and the third region 313 decreases gradually, the top surface of the isolation layer 39 in the first region 311, the second region 312, and the third region 313 gradually rises when the isolation layer 39 and the intermediate layer 40 are uniformly deposited in different regions, and the top surface of the intermediate layer 40 in the first region 311, the second region 312 and the third region 313 gradually rises.

In the embodiment, the isolation layer 39 comprises a first isolation layer 391 and a second isolation layer 392 stacked in sequence, wherein the first isolation layer 391 has a lower hardness than the second isolation layer 392 but a bigger thickness than the second isolation layer 392, which helps shorten the etching duration of the isolation layer 39; and the intermediate layer 40 comprises a first intermediate layer 401 and a second intermediate layer 402 stacked in sequence, wherein the first intermediate layer 401 has a lower hardness than the second intermediate layer 402 but a bigger thickness than the second intermediate layer 402, which helps shorten the etching duration of the intermediate layer 40.

The second isolation layer 392 may have the same material as the first mask layer 342, the first intermediate layer 401 may have the same material as the first isolation layer 391, the second intermediate layer 402 is used as a hard mask layer, and the second intermediate layer 402 may have the same material as the second protective layer 332, which helps lessen the types of materials required for the semiconductor manufacturing process and the types of etching agents and reduce the cost and the complexity of the semiconductor manufacturing process.

Figure 27:
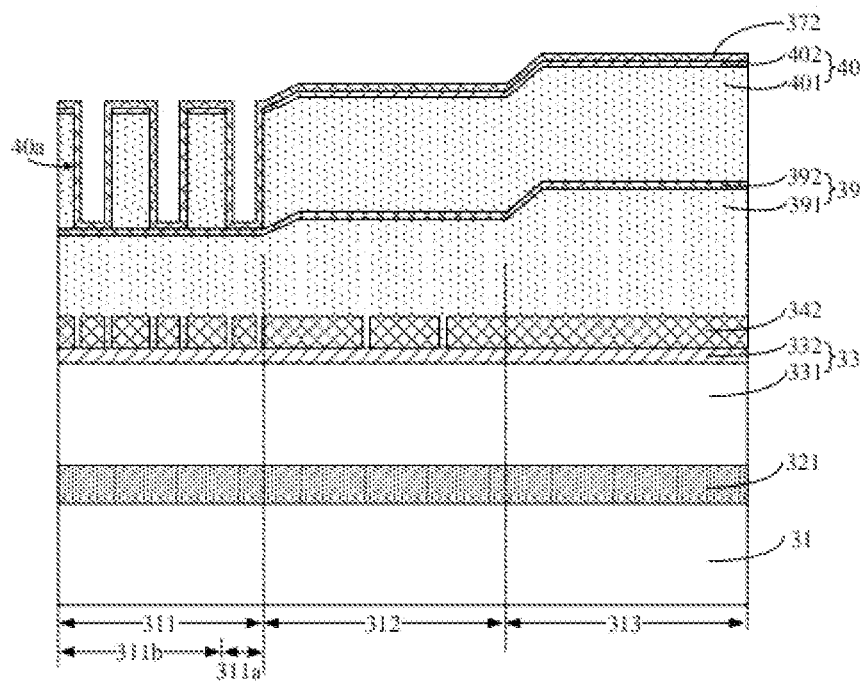

Referring to FIG. 27, at least one first trench 40a is formed in the intermediate layer 40 in the first region 311, wherein the first trench 40a exposes the surface of the isolation layer 39; and a sacrificial layer 372 is formed, wherein the sacrificial layer 372 covers the bottom and the sidewall of the first trench 40a as well as the top surface of the intermediate layer 40 which covers the first region 311, the second region 312 and the third region 313.

In the embodiment, the first region 311 comprises a first edge region 311a adjacent to the second region 312 and a first central region 311b remote from the second region 312, wherein the first trench 40a is at least partially disposed in the first edge region 311a and the sacrificial layer 372 covering the sidewall of the first trench 40a is at least partially disposed in the first edge region 311a; in addition, the sacrificial layer 372 may have the same material as the second isolation layer 392.

In the embodiment, the first trench 40a has a second extending direction, for example, a direction of 60°. The orthographic projection of the first extending direction is diagonal to the orthographic projection of the second extending direction in a plane parallel to the substrate 31.

Figure 28:
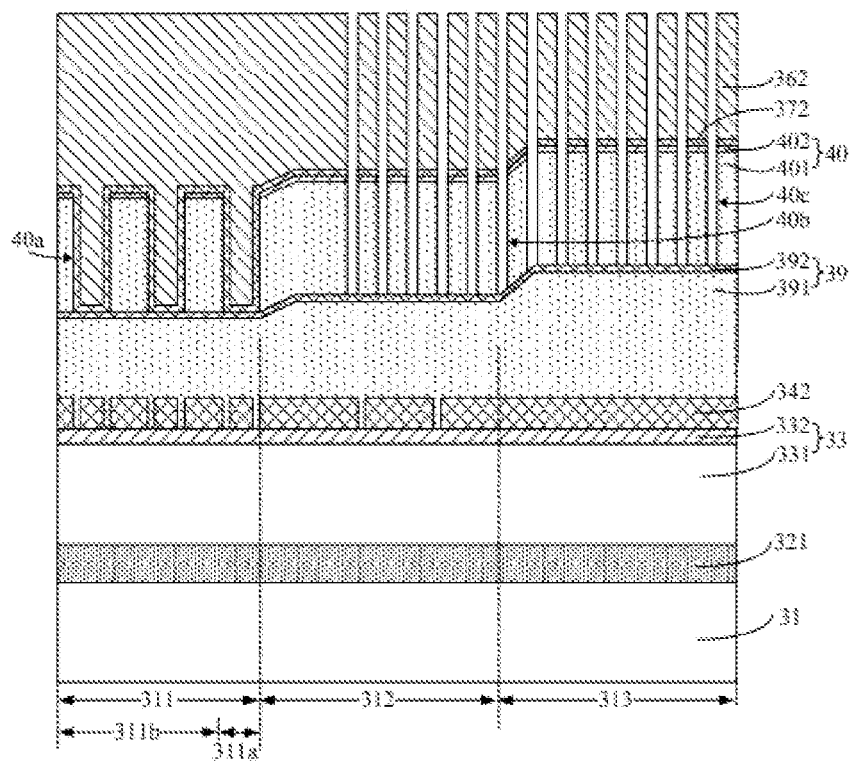

Referring to FIG. 28, a second photoresist layer 362 is formed, which fills the first trench 40a and is disposed on the intermediate layer 40 in the first region 311, the second region 312, and the third region 313. And the second photoresist layer 362 has a second opening pattern, through which the intermediate layer 40 is etched.

In the embodiment, the second opening pattern of the second photoresist layer 362 is disposed at least in the second region 312, and the intermediate layer 40 is etched with the second opening pattern to form at least one second trench 40b in the second region 312, which helps the subsequently formed fill layer partially fill into the second trench 40b, thereby reducing the difference between the height of the top surface of the fill layer in the first region 311 and the height of the top surface of the fill layer in the second region 312, preventing a portion of the fill layer material in the second region 312 from sliding to the first region 311 for lack of support, and ensuring that the thickness of the fill layer on the intermediate layer 40 in the first edge region 311a and the first central region 311b of the first region 311 remains the same.

In the embodiment, the second trench 40b has a smaller opening width than the first trench 40a in a direction parallel to the substrate 31, thereby avoiding etching through the second isolation layer 392 due to the etch loading effect, ensuring the isolating effect of the second isolation layer 392 and avoiding etching the first isolation layer 391 and the first mask layer 342 in case the second isolation layer 392 is etched through; meanwhile, the arrangement density of the second trenches 40b is higher than the arrangement density of the first trenches 40a, which helps the second trenches 40b in the second region 312 accommodate more fill layer material, so that the height difference between the top surface of the fill layer in the first region 311 and the top surface of the fill layer in the second region 312 is small after the fill layer is formed and the fill layer material in the second region 312 is prevented from sliding to the first region 311.

Further, the thickness of the subsequently formed fill layer on the intermediate layer 40 in the first region 311 and in the second region 312 is equaled by adjusting the opening width and the arrangement density of the second trenches 40b. Therefore, after the fill layer is formed, the fill layer on the intermediate layer 40 in the first region 311 and the second region 312 can be etched by the same maskless dry etching process to expose the top surface of the sacrificial layer 372.

In the embodiment, the second opening pattern of the second photoresist layer 362 is also disposed in the third region 313. In the same process as etching a portion of the intermediate layer 40 in the second region 312 through the second opening pattern, a portion of the intermediate layer 40 in the third region 313 is etched to form a third trench 40c. Therefore, the third trench 40c in the third region 313 can accommodate a portion of the subsequently deposited fill layer material, which helps prevent the fill layer material in the third region 313 from sliding to the first region 311 and helps a portion of the fill layer material in the second region 312 slide to the third region 313, thereby further reducing the height difference between the top surface of the fill layer in the first region 311 and the top surface of the fill layer in the second region 312 in a direction perpendicular to the top surface of the substrate 31.

It should be noted that when the second region 312, due to external restrictions, cannot have the second trenches 40b formed in high arrangement density, a portion of the fill layer material in the second region 312 is directed to slide to the third region 313, which can ease to some extent the problem of the low arrangement density of the second trenches 40b in the second region 312, ensure that the height difference between the top surface of the fill layer in the first region 311 and the top surface of the fill layer in the second region 312 is smaller than a first preset value, and prevent a portion of the fill layer material in the second region 312 from sliding to the first region 311.

In the embodiment, the opening width of the third trench 40c is equal to the opening width of the second trench 40b and the arrangement density of the third trenches 40c is equal to the arrangement density of the second trenches 40b. By providing both the second trench 40c and the third trench 40c with the same accommodating capacity per unit area, the fill layer on the intermediate layer 40 in the second region 312 and the fill layer on the intermediate layer 40 in the third region 313 can have same thickness in the process of depositing the fill layer, so that after the fill layer is formed, the fill layer on the intermediate layer 40 in the first region 311, the second region 312 and the third region 313 can be etched by the same maskless dry etching process to expose the sacrificial layer 372.

Figure 29:
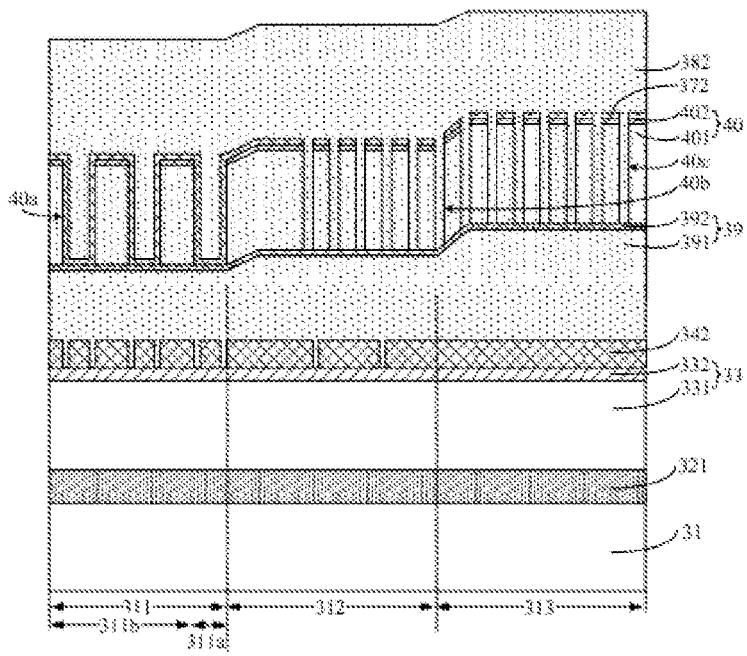

Referring to FIG. 29, the second photoresist layer is removed, and a fill layer 382 is formed which fills the first trench 40a, the second trench 40b and the third trench 40c, wherein the top surface of the fill layer 382 in each region is higher than the top surface of the intermediate layer 40 in the corresponding region.

In the embodiment, the fill layer 382 is formed by a spin-coating process which has a faster rate in layer formation and helps shorten the manufacturing process; furthermore, the material of the fill layer 382 comprises carbon or carbon-containing organic substances which are soft in texture and are easy to be etched and removed, thereby further shortening the manufacturing process of the semiconductor structure.

In the embodiment, the height difference between the top surface of the fill layer 382 in the first region 311 and the top surface of the fill layer 382 in the second region 312 is smaller than or equal to the first preset value, which helps prevent a portion of the fill layer 382 material in the second region 312 from sliding to the first region 311 due to lack of support; furthermore, the height difference between the top surface of the fill layer 382 in the first region 311 and the top surface of the fill layer 382 in the third region 313 is smaller than or equal to the second preset value which is greater than the first preset value, which helps prevent a portion of the fill layer material of the third region 313 from sliding to the first region 311 due to lack of support.

In addition, the thickness of the fill layer 382 on the intermediate layer 40 in the first edge region 311a is equal to that in the first central region 311b, and the fill layers 382 on the intermediate layers 40 in the first region 311, the second region 312, and the third region 313 have the same thickness.

In the embodiment, the fill layer 382 has the same material as the first intermediate layer 401 such that the same etching agent can subsequently be used to etch a mixed layer composed of the first intermediate layer 401 and the remaining fill layer 382 at a fast rate to form the second opening and the third opening, thereby avoiding the problem of uneven etching and the further problem of an inaccurate opening pattern, guaranteeing the accurate formation of the second opening and the third opening, and performing accurate etching of the first mask layer 342.

Figure 30:
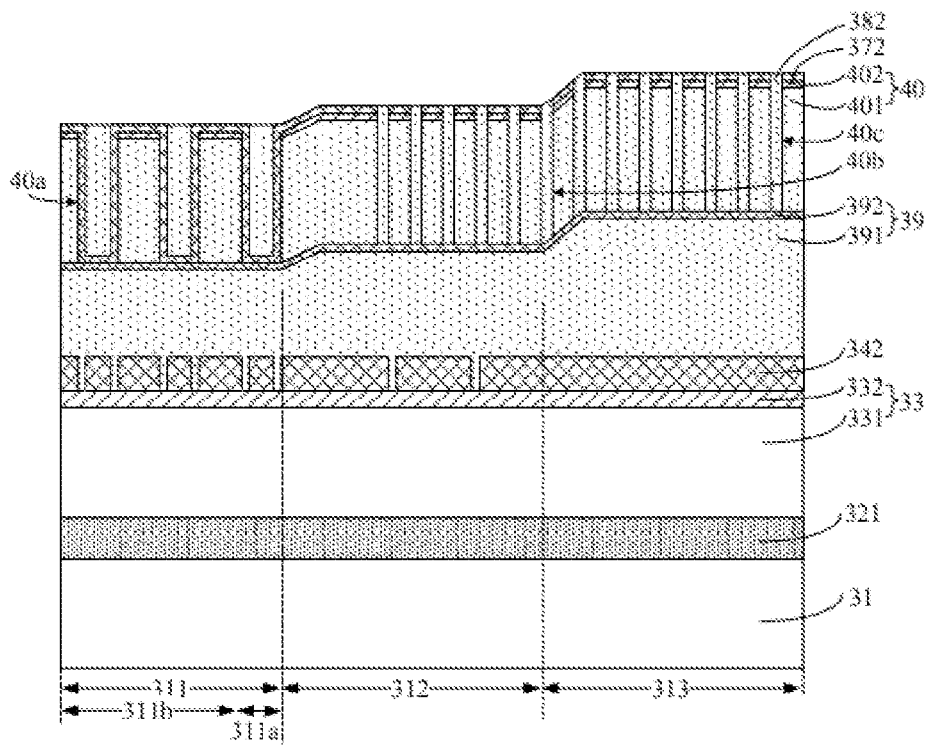

Referring to FIG. 30, the maskless dry etching process is performed to remove a portion of the fill layer 382 in the first region 311 until the top surface of the sacrificial layer 372 is exposed and until the remaining fill layer 382 in the first region 311 fills the first trench 40a.

In the embodiment, the fill layer 382 on the intermediate layer 40 in the first region 311, the second region 312, and the third region 313 is removed in the same step of the process as the top surface of the sacrificial layer 372 in the first region 311, the second region 312, and the third region 313 is exposed.

Since the thickness of the fill layer 382 on the intermediate layer 40 in the first edge region 311a is equal to that in the first central region 311b, the maskless dry etching process can simultaneously expose the top surface of the sacrificial layer 371 in the first edge region 311a and the first central region 311b without having to over-etch the fill layer 382 in the first trench 40a to expose the top surface of the sacrificial layer 371 in the first edge region 311a after the top surface of the sacrificial layer 371 in the first central region 311b is exposed. Accordingly, the fill layer 382 in the first trench 40a tends to have good integrity, thereby ensuring that the first opening subsequently formed by etching the sacrificial layer 372 on the sidewall of the first trench 40a with the intermediate layer 40 and the fill layer as a mask meets the requirements of the preset pattern, and avoiding an oversized first opening caused by etching a portion of the fill layer 382 in the first trench 40a.

In addition, since the fill layer 382 on the intermediate layer 40 in the second region 312 and the third region 313 is removed simultaneously, no separate etching processes need to be performed to selectively remove the remaining fill layer 382 on the intermediate layer 40 in the second region 312 and the third region 313 before the formation of the second opening and the third opening, which helps shorten the duration of manufacturing the semiconductor structure; further, as the fill layer 382 in the second trench 40b and the third trench 40c is not over-etched by the maskless dry etching process, there will not be the problem of an oversized opening caused by over-etching, thereby ensuring the accuracy of the patterns of the second opening and the third opening which are formed later by etching a mixed layer composed of the intermediate layer 40 and the remaining fill layer 382.

Figure 31:
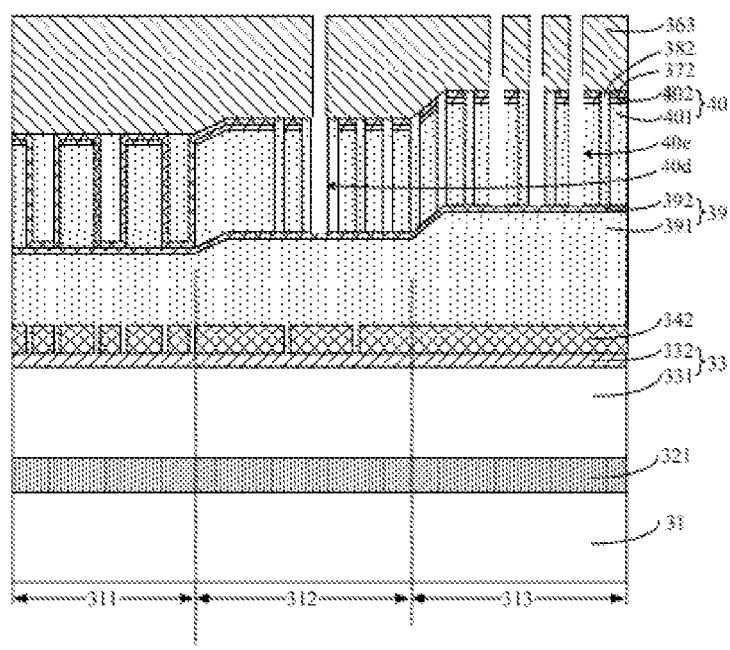

Referring to FIG. 31, a third photoresist layer 363 is formed, which has a third opening pattern disposed in the second region 312 and the third region 313; a mixed layer composed of the intermediate layer 40 and the remaining fill layer 382 is etched through the third opening pattern to form a second opening 40d disposed in the second region 312 and a third opening 40e disposed in the third region 313.

In the embodiment, the second opening 40d and the third opening 40e expose the top surface of the second isolation layer 392 such that the second isolation layer 392 exposed by the second opening 40d and the third opening 40e can be etched through in the subsequent process step of forming a first opening, with an additional process step of etching the second isolation layer 392 omitted and the etching time shortened.

Figure 32:
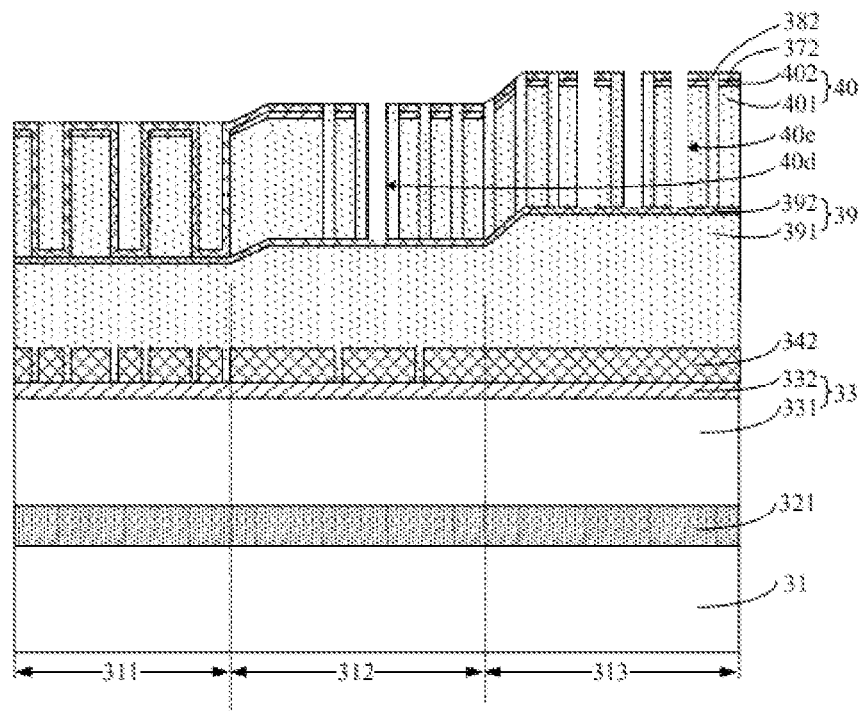
Figure 33:
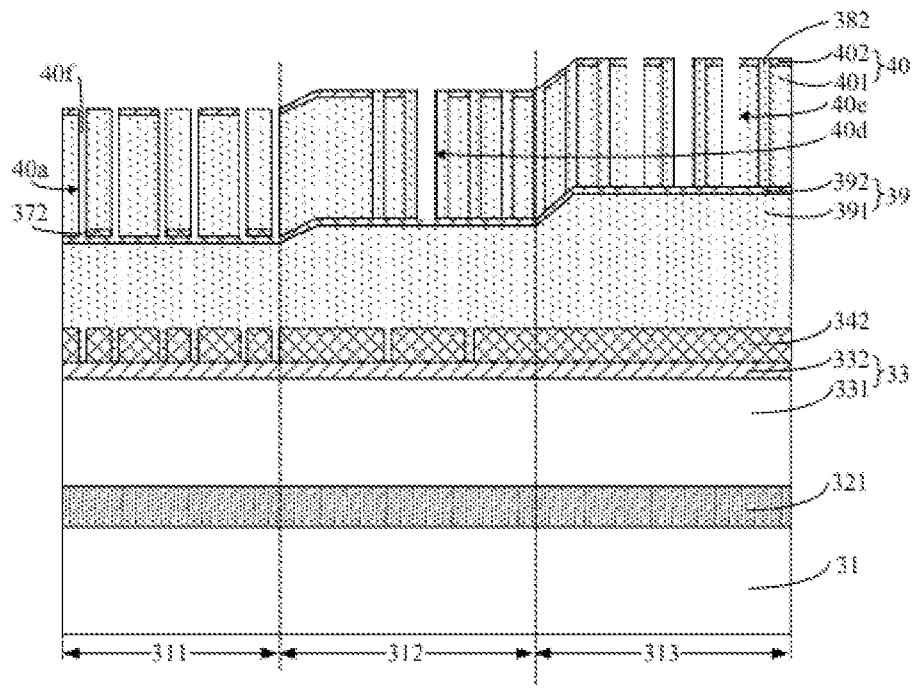

Referring to FIGS. 32 and 33, the third photoresist layer 363 is removed, and the sacrificial layer 372 on the sidewall of the first trench 40a in the first region 311 is etched to form a first opening 40f.

In the embodiment, the sacrificial layer 372 may be removed by a maskless dry etching process to etch through the second isolation layer 392 in the first region 311, the second region 312 and the third region 313 when forming the first opening 40f.

In addition, the first opening 40f, which has a second extending direction, has the same extending direction as the first trench 40a. When the first mask layer 342 is etched through the first opening 40f, a mask pattern identical to the target pattern may be formed on the first mask layer 342. Specifically, the first extending direction is 120°, the second extending direction is 60°, and a diamond-shaped target pattern may be formed on the first mask layer 342.

In addition, the second opening 40d and the third opening 40e are formed before the formation of the first opening 40f, which prevents the third photoresist layer 363 (refer to FIG. 31) from falling into the first opening 40f, thereby reducing the difficulty in removing the third photoresist layer 363 and shortening the time of removing the third photoresist layer 363.

Figure 34:
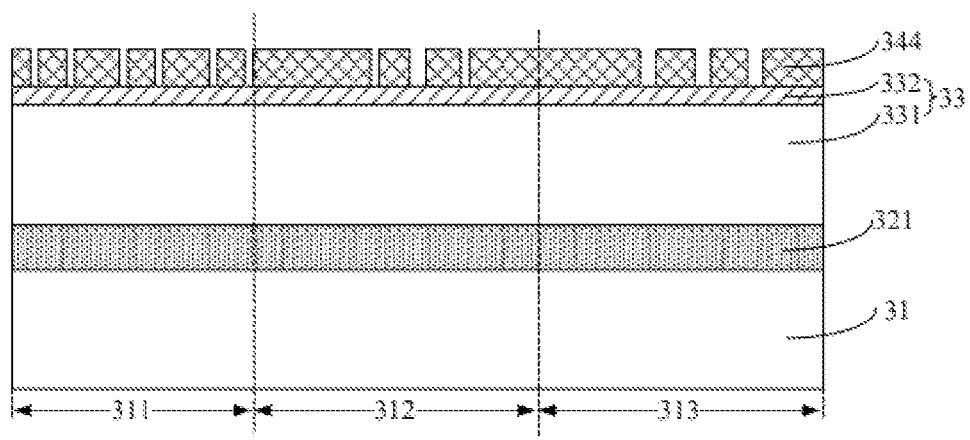

Referring to FIGS. 33 and 34, the second isolation layer 392, the first isolation layer 391, and the first mask layer 342 are sequentially etched through the first opening 40f, the second opening 40d and the third opening 40e to form a second mask layer 344, which has the same mask pattern as the target pattern; after the second mask layer 344 is formed, the remaining isolation layer 39, the remaining intermediate layer 40, the remaining fill layer 382 and the remaining sacrificial layer 372 are removed.

Figure 35:
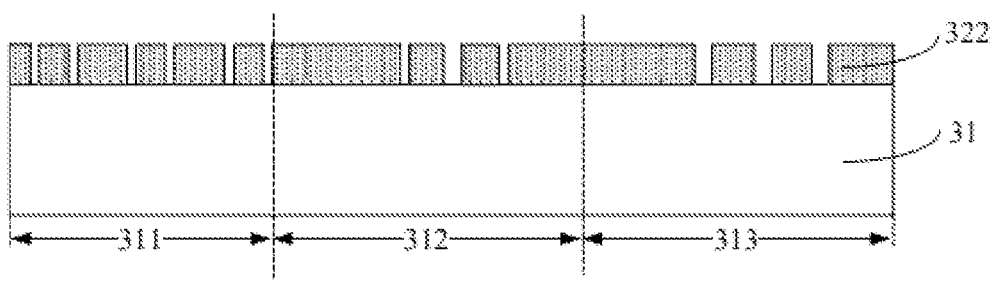

Referring to FIGS. 34 and 35, the protective layer 33 and the target layer 321 are sequentially etched using the second mask layer 344, wherein the remaining target layer 321 serves as the target pattern 322; after the target pattern 322 is formed, the second mask layer 344 and the remaining protective layer 33 are removed.

In the embodiment, before the formation of the fill layer, the second trench is formed in the second region such that a portion of the fill layer material in the second region falls into the second trench, thereby reducing the height difference between the top surface of the fill layer in the first region and the top surface of the fill layer in the second region, avoiding a collapse of the fill layer in the second region whereby a portion of the material will slide to the top of the first region and exposing all the top surface of the sacrificial layer without over-etching in the subsequent maskless dry etching process. Therefore, a complete first opening is formed and selective etching is performed completely to the target layer.

In addition, before removing the sacrificial layer on the sidewall of the first trench to form the first opening, the second opening and the third opening are formed, which prevents the photoresist layer used to form the second opening and the third opening from filling the first opening, thereby avoiding the trouble in removing the photoresist material which falls into the first opening and ensuring the effective execution of the subsequent etching process.

It will be apparent to one of ordinary skill in the art that the above described embodiments are specific embodiments to implement the present application and that in practical application various revisions in form and detail may be made thereto without departing from the spirit and scope of the present application. Any person skilled in the art may make their own revisions and modifications without departing from the spirit and scope of the present application, so the scope of protection of the present application shall be subject to the scope defined by the claims.

What is claimed is:

1. A method for manufacturing a semiconductor structure, comprising:
    providing a substrate, comprising a first region, a second region, and a third region, wherein the second region is disposed between the first region and the third region;
    forming a target layer, a first mask layer, an isolation layer and an intermediate layer sequentially on the substrate, wherein the intermediate layer in the first region has at least one first trench therein which exposes the isolation layer, and a bottom and a sidewall of the first trench are covered with a sacrificial layer;

etching a portion of the intermediate layer in the second region to form at least one second trench which is disposed in the intermediate layer in the second region;

forming a fill layer which fills the first trench and the second trench, wherein a top surface of the fill layer is higher than a top surface of the intermediate layer; and a height difference between the top surface of the fill layer in the first region and the top surface of the fill layer in the second region is smaller than or equal to a first preset value in a direction perpendicular to a top surface of the substrate;

performing a maskless dry etching process to remove a portion of the fill layer in the first region until a top surface of the sacrificial layer is exposed and until the remaining fill layer in the first region fills the first trench;

removing the sacrificial layer which covers the sidewall of the first trench to form a first opening in the first region, wherein the first opening exposes a surface of the isolation layer; and etching sequentially a portion of the isolation layer, a portion of the first mask layer and a portion of the target layer in the first region through the first opening, whereby the remaining target layer forms a target pattern.

2. The method of claim 1, wherein an opening width of the second trench is smaller than an opening width of the first trench and an arrangement density of the second trenches is higher than an arrangement density of the first trenches.

3. The method of claim 1, wherein, in the same process step of etching a portion of the intermediate layer in the second region, a portion of the intermediate layer in the third region is etched to form a third trench in the third region; and the fill layer fills the third trench, and in the direction perpendicular to the top surface of the substrate a height difference between the top surface of the fill layer in the first region and the top surface of the fill layer in the third region is smaller than or equal to a second preset value which is higher than the first preset value.

4. The method of claim 3, wherein an opening width of the third trench is equal to an opening width of the second trench and an arrangement density of the third trenches is equal to an arrangement density of the second trenches.

5. The method of claim 3, wherein the first region is an array region, the second region is a core region and the third region is a peripheral region.

6. The method of claim 1, wherein before the sacrificial layer on the sidewall of the first trench is removed, the method further comprises:

etching a portion of the intermediate layer in the second region and a portion of the intermediate layer in the third region to form a second opening and a third opening; wherein the second opening is disposed in the second region and the third opening is disposed in the third region.

7. The method of claim 6, wherein the second opening and the third opening expose a top surface of the isolation layer.

8. The method of claim 6, wherein in the same process step of sequentially etching a portion of the isolation layer, a portion of the first mask layer and a portion of the target layer on the first region through the first opening, the method further comprises:

etching sequentially a portion of the isolation layer, a portion of the first mask layer and a portion of the target layer in the second region through the second opening, and etching sequentially a portion of the isolation layer, a portion of the first mask layer and a portion of the target layer in the third region through the third opening.

9. The method of claim 6, wherein the material of the fill layer is the same as that of the intermediate layer.

10. The method of claim 1, wherein the first mask layer has a plurality of fourth openings, which have the same opening width in the direction parallel to the substrate, have a first extending direction parallel to a surface of the substrate and are filled with the isolation layer.

11. The method of claim 10, wherein an arrangement density of the fourth openings in the first region is higher an arrangement density of the fourth openings that in the second region, the top surface of the isolation layer in the second region is higher than the top surface of the isolation layer in the first region, and the top surface of the intermediate layer in the second region is higher than the top surface of the intermediate layer in the first region.

12. The method of claim 10, wherein an arrangement density of the fourth openings in the second region is higher than an arrangement density of the fourth openings in the third region, the top surface of the isolation layer in the third region is higher than the top surface of the isolation layer in the second region, and the top surface of the intermediate layer in the third region is higher than the top surface of the intermediate layer in the second region.

13. The method of claim 10, wherein the first opening has a second extending direction parallel to the surface of the substrate, and an orthographic projection of the first extending direction is diagonal to an orthographic projection of the second extending direction in a plane parallel to the substrate.

14. The method of claim 10, wherein the process of forming the first mask layer comprises the steps of:

providing the substrate, the target layer and an initial mask layer stacked in sequence;

forming on the initial mask layer an initial intermediate layer and a photoresist layer stacked in sequence, wherein the photoresist layer has an opening pattern with the first extending direction;

etching the initial intermediate layer through the opening pattern to form an intermediate trench which exposes a surface of the initial mask layer;

forming an initial sacrificial layer which covers a bottom and a sidewall of the intermediate trench, and forming an initial fill layer which fills the intermediate trench, wherein the initial fill layer exposes a top surface of the initial sacrificial layer;

removing the initial sacrificial layer which covers the sidewall of the intermediate trench to form an initial gap which exposes the surface of the initial mask layer;

etching the initial mask layer through the initial gap to form a first mask layer; and removing the remaining initial intermediate layer, the remaining initial sacrificial layer and the remaining initial fill layer after the first mask layer is formed.

15. The method of claim 1, wherein the fill layer is formed by a spin-coating process, and the material of the fill layer comprises carbon or a carbon-containing compound.

* * * * *